(12) United States Patent
Wang

(10) Patent No.: US 10,315,861 B2
(45) Date of Patent: Jun. 11, 2019

(54) PICK-AND PLACE APPARATUS FOR DISPLAY PANELS AND PICK-AND-PLACE METHOD THEREOF

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventor: Kai Wang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 268 days.

(21) Appl. No.: 15/159,353

(22) Filed: May 19, 2016

(65) Prior Publication Data

US 2017/0057757 A1 Mar. 2, 2017

(30) Foreign Application Priority Data

Sep. 2, 2015 (CN) .......................... 2015 1 0553513

(51) Int. Cl.
*B66C 1/02* (2006.01)
*B65G 49/06* (2006.01)
(Continued)

(52) U.S. Cl.
CPC ......... *B65G 49/061* (2013.01); *G02F 1/1303* (2013.01); *H01L 21/6734* (2013.01);
(Continued)

(58) Field of Classification Search
CPC ....................................................... B66C 1/02
(Continued)

(56) References Cited

U.S. PATENT DOCUMENTS

| | | | | |
|---|---|---|---|---|
| 4,789,295 A | * | 12/1988 | Boucher, Jr. | ............... B66C 1/24 294/2 |
| 2003/0059288 A1 | * | 3/2003 | Robinson | .............. B62B 3/1404 414/539 |

FOREIGN PATENT DOCUMENTS

| CN | 1279147 A | 1/2001 |
|---|---|---|
| CN | 202640356 U | 1/2013 |

(Continued)

OTHER PUBLICATIONS

Office action dated Nov. 4, 2016 for CN corresponding application 201510553513.X and English translation.

(Continued)

*Primary Examiner* — Saul Rodriguez
*Assistant Examiner* — Willie Berry, Jr.
(74) *Attorney, Agent, or Firm* — Nath, Goldberg & Meyer; Joshua B. Goldberg

(57) ABSTRACT

The present invention provides a pick-and-place apparatus for display panels and a pick-and-place method thereof. The pick-and-place apparatus for display panels comprises: an air injection unit for injecting air; and a supporting unit for extending under the display panel to support the display panel, which has a top side for supporting the display panel and an inserting side for firstly extending under the display panel, and comprises a plurality of first openings disposed at the inserting side and being communicated with the air injection unit, and a plurality of second openings disposed at the top side and being communicated with the air injection unit. With the pick-and-place apparatus for display panels of the invention, the problem of damages on display panels in the prior technology of picking and placing display panels would be solved.

6 Claims, 2 Drawing Sheets

(51) Int. Cl.
 *H01L 21/673* (2006.01)
 *H01L 21/677* (2006.01)
 *G02F 1/13* (2006.01)
(52) U.S. Cl.
 CPC .. *H01L 21/67724* (2013.01); *H01L 21/67784* (2013.01); *B65G 2249/04* (2013.01)
(58) Field of Classification Search
 USPC .......................................................... 414/627
 See application file for complete search history.

(56) References Cited

FOREIGN PATENT DOCUMENTS

| CN | 104149095 A | 11/2014 |
|---|---|---|
| DE | 3136544 A1 | 3/1983 |
| JP | H07156092 A | 6/1995 |

OTHER PUBLICATIONS

Decision of rejection dated Dec. 28, 2016 for CN corresponding application 201510553513.X.

\* cited by examiner

PICK-AND PLACE APPARATUS FOR DISPLAY PANELS AND PICK-AND-PLACE METHOD THEREOF

CROSS REFERENCES TO RELATED APPLICATIONS

This application claims the benefit of Chinese Patent Application No. 201510553513.X filed on Sep. 2, 2015 in the Chinese Intellectual Property Office, the disclosure of which is hereby incorporated in its entirety by reference.

FIELD OF THE INVENTION

The present invention relates to the field of display panel manufacturing technology, and particularly relates to a pick-and-place apparatus for display panels and a pick-and-place method thereof.

BACKGROUND OF THE INVENTION

The manufacturing process of display panels includes various processes. After one of the processes is completed, the display panel needs to be temporarily stored in a dedicated receiving means before being picked out for the next process.

In the prior art, there are two methods of picking and placing the display panel. One is using a sucking disk to suck the display panel. In this method, the sucking disk must have a strong suction force to prevent the display panel from falling accidentally, but this will cause local deformation of the display panel at the place of the sucking disk, and further cause problems such as PS (photo spacer) skew, light leak, scratches on film surfaces and circle-shaped marks. The other is operated by manual hands, but this method is labor and time consuming, with low efficiency and high cost, and tends to cause deformation of the display panel because manual actions are hard to keep consistent all the time, and even complete breakup of the display panel due to, for example, bump.

SUMMARY OF THE INVENTION

With respect to the technical problem that the prior pick-and-place technology of display panels tends to cause damage on the display panel, the present invention provides a pick-and-place apparatus for display panels and a pick-and-place method thereof that can prevent the display panel from being damaged.

According to a first aspect of the invention, there is provided a pick-and-place apparatus for display panels, comprising:
  an air injection unit for injecting air; and
  a supporting unit for extending under the display panel to support the display panel, which has a top side for supporting the display panel and an inserting side for firstly extending under the display panel, and comprises a plurality of first openings disposed at the inserting side and being communicated with the air injection unit and a plurality of second openings disposed at the top side and being communicated with the air injection unit.

According to a second aspect of the invention, there is provided the pick-and-place apparatus for display panels according to the first aspect,
  wherein the air injection unit is an air injection/suction unit for injecting or sucking air.

According to a third aspect of the invention, there is provided the pick-and-place apparatus for display panels according to the first aspect,
  wherein the supporting unit further comprises an inserting element disposed at the inserting side that has a wedge structure with a thickness tapering in a direction away from the inserting side.

According to a fourth aspect of the invention, there is provided the pick-and-place apparatus for display panels according to the third aspect,
  wherein the inserting element is made up of rubber or plastic.

According to a fifth aspect of the invention, there is provided the pick-and-place apparatus for display panels according to the first aspect,
  wherein the supporting unit comprises a plurality of supporting rods, one end of which is the inserting side.

According to a sixth aspect of the invention, there is provided the pick-and-place apparatus for display panels according to the fifth aspect,
  wherein each of the supporting rods has one of the second openings thereon along a length direction thereof every 10-20 cm.

According to a seventh aspect of the invention, there is provided the pick-and-place apparatus for display panels according to the fifth aspect, further comprising:
  a bracket unit having a receiving section for receiving the supporting rods that can retract into or stretch out of the receiving section and become vertical to the receiving section when stretching out.

According to an eighth aspect of the invention, there is provided the pick-and-place apparatus for display panels according to the seventh aspect,
  wherein the bracket unit further comprises a connecting section that is connected to the receiving section and disposed above the supporting rods when the supporting rods stretch out.

According to a ninth aspect of the invention, there is provided the pick-and-place apparatus for display panels according to the first aspect, further comprising:
  a lifting unit for driving the supporting unit to move up and down.

According to a tenth aspect of the invention, there is provided the pick-and-place apparatus for display panels according to the first aspect, further comprising:
  a moving unit for driving the supporting unit to move horizontally.

According to an eleventh aspect of the invention, there is provided a pick-and-place method of the pick-and-place apparatus for display panels according to the first aspect, the pick-and-place method comprising the following steps:
  placing the display panel into a receiving means; and
  picking the display panel out of the receiving means.

According to a twelfth aspect of the invention, there is provided the pick-and-place method of the pick-and-place apparatus for display panels according to the eleventh aspect,
  wherein the step of placing the display panel into a receiving means comprises:
  blowing up the display panel by injecting air with the air injection unit, and extending the supporting unit under the display panel to support the display panel;
  stopping injecting air or starting sucking air with the air injection unit, and then transferring the display panel to the receiving means; and
  blowing up the display panel by injecting air with the air injection unit, and retracting the supporting unit from under the display panel so that the display panel is placed at a desired location in the receiving means.

According to a thirteenth aspect of the invention, there is provided the pick-and-place method of the pick-and-place apparatus for display panels according to the eleventh aspect, wherein the step of picking the display panel out of the receiving means comprises:

blowing up the display panel by injecting air with the air injection unit, and extending the supporting unit under the display panel to support the display panel;

stopping injecting air or starting sucking air with the air injection unit, and then transferring the display panel to a location outside of the receiving means; and blowing up the display panel by injecting air with the air injection unit, and retracting the supporting unit from under the display panel so that the display panel is placed at a location outside of the receiving means.

According to a fourteenth aspect of the invention, there is provided the pick-and-place method of the pick-and-place apparatus for display panels according to the twelfth aspect, wherein the step of blowing up the display panel by injecting air with the air injection unit comprises:

the air injection unit injecting air from the first openings disposed at the inserting side to blow up an edge of the display panel; and the air injection unit injecting air from the second openings disposed at the top side to blow up the display panel above the supporting unit.

According to a fifteenth aspect of the invention, there is provided the pick-and-place method of the pick-and-place apparatus for display panels according to the thirteenth aspect, wherein the step of blowing up the display panel by injecting air with the air injection unit comprises:

the air injection unit injecting air from the first openings disposed at the inserting side to blow up an edge of the display panel; and the air injection unit injecting air from the second openings disposed at the top side to blow up the display panel above the supporting unit.

According to a sixteenth aspect of the invention, there is provided the pick-and-place method of the pick-and-place apparatus for display panels according to the twelfth aspect, wherein the step of retracting the supporting unit from under the display panel comprises:

receiving the supporting unit into a receiving section in a folded or retracted manner.

According to a seventeenth aspect of the invention, there is provided the pick-and-place method of the pick-and-place apparatus for display panels according to the thirteenth aspect, wherein the step of retracting the supporting unit from under the display panel comprises:

receiving the supporting unit into a receiving section in a folded or retracted manner.

In the pick-and-place apparatus for display panels according to the first aspect and the pick-and-place method of the pick-and-place apparatus for display panels according to the eleventh to fifteenth aspects, the supporting unit has first openings from which injected air can lift up an edge of the display panel, so that an inserting side of the supporting unit may extend under the display panel and then, injected air from second openings gradually lifts up the display panel and makes the supporting unit insert under the display panel slowly and finally support the display panel. The above pick-and-place process realizes soft contact by air, instead of directly applying a force to the display panel, thereby preventing severe deformation of the display panel and damages thereon.

In the pick-and-place apparatus according to the second aspect, by air injection, the display panel is blown up to facilitate inserting the supporting unit thereunder, and by air suction, the display panel is sucked on the supporting unit to prevent the display panel from sliding off the supporting unit and give the display panel better protection.

In the pick-and-place apparatus for display panels according to the third aspect, it may make the inserting operation more convenient.

In the pick-and-place apparatus for display panels according to the fourth aspect, it may prevent the inserting element from damaging the display panel.

In the pick-and-place apparatus for display panels according to the fifth aspect, it may facilitate observation and reduce cost.

In the pick-and-place apparatus for display panels according to the sixth aspect, it may reach a good effect of air injection.

In the pick-and-place apparatus for display panels according to the seventh aspect and the pick-and-place method of the pick-and-place apparatus for display panels according to the sixteenth to seventeenth aspects, it may enable the pick-and-place apparatus for display panels to be operable within a narrow space.

In the pick-and-place apparatus for display panels according to the eighth aspect, the connecting section may have a function of protecting the top side of the display panel.

In the pick-and-place apparatus for display panels according to the ninth to tenth aspects, it may enable the pick-and-place apparatus for display panels to be operable at different heights or horizontal positions, thereby enlarging the application range thereof.

DETAILED DESCRIPTION OF THE EMBODIMENTS

Figure 1:
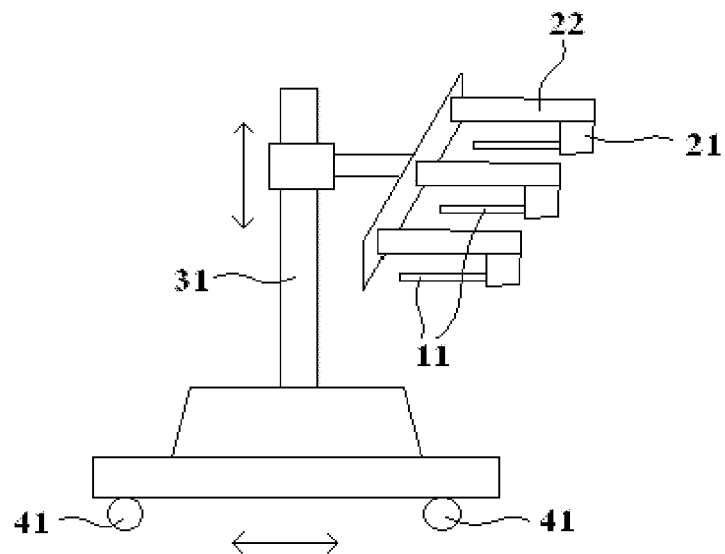
FIG. 1 is a schematic view showing the whole structure of a pick-and-place apparatus for display panels according to the embodiment of the invention.
Figure 2:
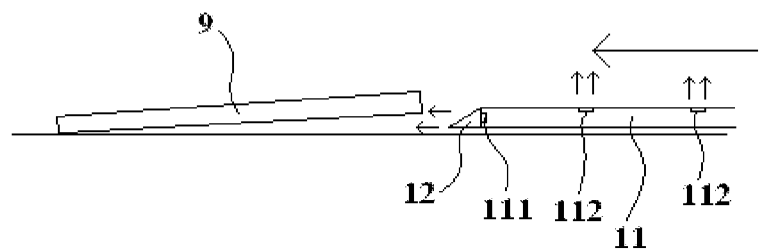
FIG. 2 is a schematic view showing one of the steps of using the pick-and-place apparatus for display panels according to the embodiment of the invention to pick the display panel.
Figure 3:
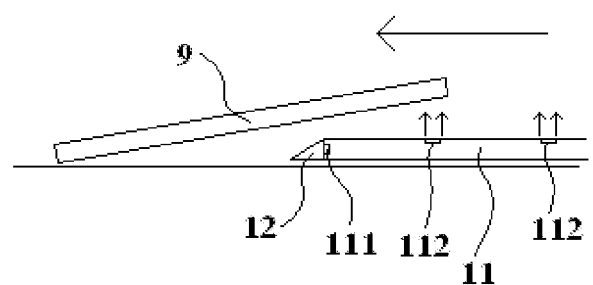
FIG. 3 is a schematic view showing another step of using the pick-and-place apparatus for display panels according to the embodiment of the invention to pick the display panel.
Figure 4:
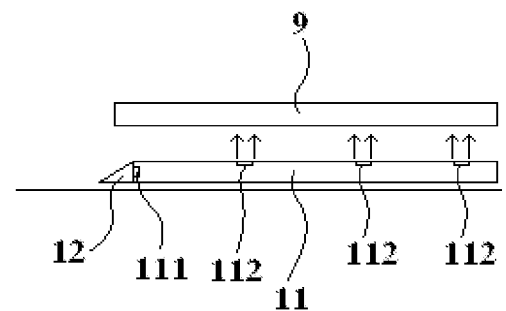
FIG. 4 is a schematic view showing yet another step of using the pick-and-place apparatus for display panels according to the embodiment of the invention to pick the display panel.

In order that those skilled in the art can better understand the disclosure, the pick-and-place apparatus for display panels and the pick-and-place method thereof according to the invention will be illustrated below in detail in conjunction with the accompany drawings and specific embodiments.

According to one aspect of the invention, there is provided a pick-and-place apparatus for display panels.

As shown in FIGS. 1-6, the pick-and-place apparatus for display panels according to the embodiment is used for picking and placing a display panel 9 in different processes during the manufacturing process of display panels. The display panel 9 includes, for example, a liquid crystal display panel, or an organic light emitting diode display panel.

The pick-and-place apparatus for display panels comprises an air injection unit and a supporting unit, wherein the air injection unit (not shown) is used for injecting air and, when being connected to openings of the supporting unit, making the openings inject air to the outside. Specifically, the air injection unit may be a known device such as a draught fan.

The supporting unit is used for extending under the display panel 9 to support the display panel 9. The supporting unit has a top side for supporting the display panel 9 and an inserting side for firstly extending under the display panel 9, and comprises a plurality of first openings 111 disposed at the inserting side and being communicated with the air injection unit, and a plurality of second openings 112 disposed at the top side and being communicated with the air injection unit.

That is, the supporting unit may insert under the display panel 9 to support and move the display panel 9. A side of the supporting unit that firstly inserts under the display panel 9 is called the inserting side (or front end), and is provided with first openings 111 that are communicated with the air injection unit and can inject air to the outside, while a side of the supporting unit that contacts the display panel 9 is called the top side, and is provided with second openings 112 that are communicated with the air injection unit and can inject air to the outside (preferably, and suck air). A direction of the air injected from the first openings 111 is vertical to that from the second openings 112, but it should be understood that, according to actual requirements, an angle between the direction of the air injected from the first openings 111 and that from the second openings 112 may be set at any degree, such as 60, 80 or 120 degrees.

As shown in FIGS. 2-5, when picking the display panel 9, the inserting side of the supporting unit firstly extends to the external around an edge of the display panel 9 and blows up the edge of the display panel 9 by injecting air from the first openings 111, and then the inserting side inserts under the edge of the display panel 9. At this time, injected air from the second openings 112 also blows up the display panel 9 above the supporting unit. The supporting unit continues inserting, until completely under the display panel 9. At this moment, the air injection unit stops injecting air, so that the display panel 9 is supported by the supporting unit and can be transferred to a desired location.

Similarly, when the display panel 9 needs to be placed, each opening starts injecting air to raise the display panel 9, so that the supporting unit can retract from under the display panel 9 gradually and finally place the display panel 9 at the desired location. This process is in reverse to that of picking the display panel 9, thus will not be discussed in detail herein.

As can be seen, both of picking and placing the display panel 9 with the pick-and-place apparatus for display panels of the embodiment firstly move the display panel 9 by air, i.e., the contact between the pick-and-place apparatus for display panels and the display panel 9 is always soft contact, instead of directly applying a force to the display panel 9, thereby preventing severe deformation of the display panel 9 and damages thereon.

Figure 5:
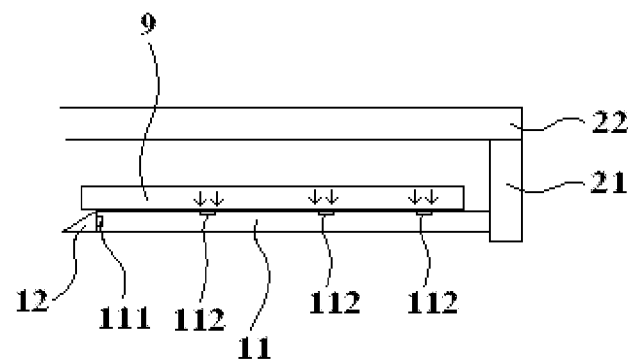
FIG. 5 is a schematic view showing the supporting unit of the pick-and-place apparatus for display panels according to the embodiment of the invention for supporting the display panel.

Preferably, said air injection unit is one used for injecting or sucking air, i.e., it also has a function of sucking air besides injecting air, thereby the openings can also suck air. Thus, as shown in FIG. 5, when the display panel 9 is placed on the supporting unit and transferred, the injection/suction air unit sucks air, so that the display panel 9 is sucked on the supporting unit by each of the second openings 112, thereby preventing the display panel 9 from sliding off the supporting unit and giving the display panel 9 better protection.

Preferably, the supporting unit further comprises an inserting element 12 disposed at the inserting side that has a wedge structure with a thickness tapering in a direction away from the inserting side. More preferably, the inserting element 12 is made up of rubber or plastic.

That is, as shown in FIGS. 2-6, the supporting unit further comprises an inserting element 12 with a tip at the inserting side, so that when the supporting unit inserts under the display panel 9, the tip of the inserting element 12 firstly inserts into a gap between the display panel 9 and a placement surface, then other parts enter in turn, so as to facilitate the inserting operation. In the embodiment, in order to prevent the inserting element 12 from damaging the display panel 9, the inserting element 12 is preferably made up of soft materials such as rubber or plastic.

Preferably, the supporting unit comprises a plurality of supporting rods 11, one end of which is the inserting side.

That is, as shown in FIG. 1, the supporting unit may be in the form of a plurality of supporting rods 11 which are preferably disposed to align with and parallel to each other. Such structure may facilitate observation and reduce cost.

More preferably, each of the supporting rods 11 has one of the second openings 112 thereon along a length direction thereof every 10-20 cm.

When the supporting unit is in the form of supporting rods 11, the second openings 112 shall be arranged along a length direction of the supporting rods 11. Researches show that the second openings 12 within such spacing range may have a great effect of air injection.

Preferably, the pick-and-place apparatus for display panels further comprises a bracket unit having a receiving section 21 for receiving the supporting rods 11 that can retract into or stretch out of the receiving section 21 and become vertical to the receiving section 21 when stretching out.

Figure 6:
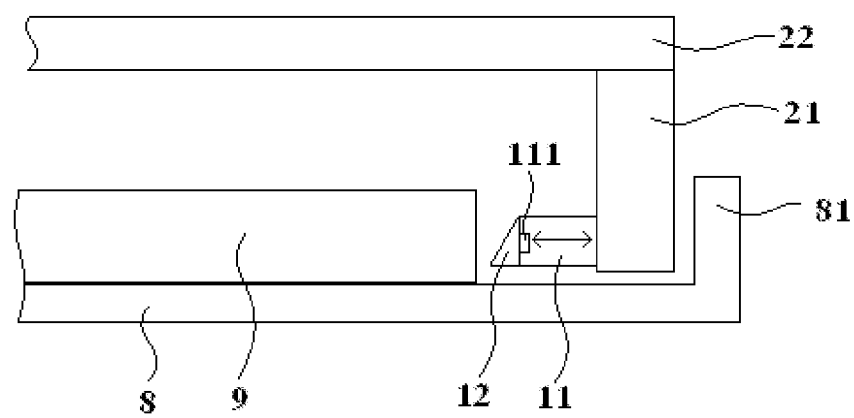
FIG. 6 is a schematic view showing the pick-and-place apparatus for display panels according to the embodiment of the invention picking the display panel out of the receiving means.

The display panel 9 is usually placed in a dedicated receiving means 8, which unavoidably has a flange 81. In such case, the supporting rods 11 will be blocked by the flange 81 of the receiving means 8 if the supporting rods 11 are required to directly insert under the display panel 9. Thus, the pick-and-place apparatus for display panels may further comprise a receiving section 21 arranged along a vertical direction and said supporting rods 11 may be received in or gradually stretch out of the receiving section 21. Thus, taking the case of picking the display panel 9 as an example, as shown in FIG. 6, the receiving section 21 may firstly extend into a gap between the flange 81 of the receiving means 8 and a side of the display panel 9, and then the supporting rods 11 gradually stretch out from the receiving section 21 and insert under the display panel 9 to complete the task of picking the display panel 9. Such configuration enables the pick-and-place apparatus for display panels to be operable within a narrow space.

Specific forms to realize extension and retraction of the supporting rods are various.

For example, each of the supporting rods 11 is comprised of multiple sections of hollow sleeves with tapering diameters, and each of the sleeves has holes on a wall thereof, so that each sleeve may be extended and retracted in a manner like "television antenna", wherein the holes on the sleeve wall are the above discussed openings.

Or, each of the supporting rods 11 is comprised of multiple sections of hard tubes, and ends of each tube are connected by a pivot-like means such that the multiple sections of hard tubes may be folded to each other and retracted. In such case, each of the hard tubes may be provided with a hose therein that is connected with the air injection unit and includes holes forming the above openings.

Preferably, the bracket unit further comprises a connecting section 22 that is connected to the receiving section 21 and disposed above the supporting rods 11 when the supporting rods 11 stretch out.

That is, the receiving section 21 is preferably connected onto the connecting section 22 which is disposed oppositely to the supporting rods 11 when the supporting rods 11 stretch out. Thus, as shown in FIG. 5, when the supporting rods 11 support the display panel 9, the display panel 9 is actually located between the supporting rods 11 and the connecting section 22 such that the connecting section 22 may play a function of protecting the top surface of the display panel 9. It should be understood that although the connecting section 22 is shown in the form of a plurality of "rods", it may also include other shapes such as plate.

Preferably, the pick-and-place apparatus for display panels further comprises a lifting unit for driving the supporting unit to move up and down.

Since the display panel 9 may be stored at different heights, the supporting unit is preferably able to be moved up and down so as to operate the display panel 9 at different heights. Such configuration enables the pick-and-place apparatus for display panels to be operable at different heights, thereby enlarging the application range thereof.

Specific forms of the lifting unit are various, for example, the bracket unit may be disposed on a vertical bar 31 along which the bracket unit can be moved up and down (for example, driven by a cylinder) to drive the supporting unit to move up and down. The lifting unit may also be a plurality of other known forms (for example, a retractable vertical bar 31), thus will not be discussed in detail herein.

Preferably, the pick-and-place apparatus for display panels further comprises a moving unit for driving the supporting unit to move horizontally.

Obviously, the display panel 9 should be placed at a different location after being picked, which process may be completed by manually holding the supporting unit, but preferably, the supporting unit can be driven to move by the moving unit. Such configuration enables the pick-and-place apparatus for display panels to be operable at different horizontal positions, thereby enlarging the application range thereof.

Specific forms of the moving unit are various, for example, in the embodiment, the vertical bar 31 of the lifting unit may be disposed on a platform which has a wheel 41 at the bottom thereof to drive the supporting unit to move together. The moving unit may also be a plurality of other known forms (for example, a rail hanging the supporting unit), thus will not be discussed in detail herein.

According to another aspect of the invention, there is provided a pick-and-place method of the pick-and-place apparatus for display panels, the method comprises a step of placing the display panel 9 into a receiving means and a step of picking the display panel 9 out of the receiving means.

In the embodiment, the step of placing the display panel 9 into a receiving means comprises: blowing up the display panel 9 by injecting air with the air injection unit, and extending the supporting unit under the display panel 9 to support the display panel 9, wherein the step of blowing up the display panel 9 by injecting air with the air injection unit comprises the air injection unit injecting air from the first openings 111 at the inserting side to blow up an edge of the display panel 9, and the air injection unit injecting air from the second openings 112 at the top side to blow up the display panel 9 above the supporting unit; stopping injecting air or starting sucking air with the air injection unit, and then transferring the display panel 9 to the receiving means; and blowing up the display panel 9 by injecting air with the air injection unit, and retracting the supporting unit from under the display panel 9 so that the display panel 9 is placed at a desired location in the receiving means, wherein the step of retracting the supporting unit from under the display panel 9 comprises receiving the supporting unit into the receiving section 21 in a folded or retracted manner.

In addition, the process of picking the display panel 9 out of the receiving means is in reverse to that of placing the display panel 9 into the receiving means, thus will not be discussed in detail herein.

It should be understood that the above embodiments are merely exemplary embodiments for the purpose of illustrating the principle of the present invention, and the present invention is not limited thereto. Various modifications and improvements can be made by a person having ordinary skill in the art without departing from the spirit and essence of the present invention. Accordingly, all of the modifications and improvements also fall into the protection scope of the present invention.

The invention claimed is:

1. A pick-and-place method of a pick-and-place apparatus for display panels, the pick-and-place apparatus for display panels comprising: an air injection unit for injecting air; and a supporting unit for extending under the display panel to support the display panel, which has a top side for supporting the display panel and an inserting side for firstly extending under the display panel, and comprises a plurality of first openings disposed at the inserting side and being communicated with the air injection unit, and a plurality of second openings disposed at the top side and being communicated with the air injection unit, the pick-and-place method comprising the following steps:

placing the display panel into a receptacle; and
picking the display panel out of the receptacle,
wherein the step of placing the display panel into a receptacle comprises:
blowing up the display panel by injecting air with the air injection unit, and extending the supporting unit under the display panel to support the display panel;
stopping injecting air or sucking air with the air injection unit, and then transferring the display panel to the receptacle; and
blowing up the display panel by injecting air with the air injection unit, and retracting the supporting unit from under the display panel so that the display panel is placed at a desired location in the receptacle.

2. The pick-and-place method of the pick-and-place apparatus for display panels according to claim 1,
wherein the step of picking the display panel out of the receptacle comprises:

blowing up the display panel by injecting air with the air injection unit, and extending the supporting unit under the display panel to support the display panel;

stopping injecting air or starting sucking air with the air injection unit, and then transferring the display panel to a location outside of the receptacle; and blowing up the display panel by injecting air with the air injection unit, and retracting the supporting unit from under the display panel so that the display panel is placed at a location outside of the receptacle.

3. The pick-and-place method of the pick-and-place apparatus for display panels according to claim 2, wherein the step of blowing up the display panel by injecting air with the air injection unit comprises:

the air injection unit injecting air from the first openings disposed at the inserting side to blow up an edge of the display panel; and the air injection unit injecting air from the second openings disposed at the top side to blow up the display panel above the supporting unit.

4. The pick-and-place method of the pick-and-place apparatus for display panels according to claim 2, wherein the step of retracting the supporting unit from under the display panel comprises:

receiving the supporting unit into a receiving section in a folded or retracted manner.

5. The pick-and-place method of the pick-and-place apparatus for display panels according to claim 1, wherein the step of blowing up the display panel by injecting air with the air injection unit comprises:

the air injection unit injecting air from the first openings disposed at the inserting side to blow up an edge of the display panel; and the air injection unit injecting air from the second openings disposed at the top side to blow up the display panel above the supporting unit.

6. The pick-and-place method of the pick-and-place apparatus for display panels according to claim 1, wherein the step of retracting the supporting unit from under the display panel comprises:

receiving the supporting unit into a receiving section in a folded or retracted manner.

* * * * *